(12) United States Patent
Higuchi et al.

(10) Patent No.: US 6,737,690 B2
(45) Date of Patent: May 18, 2004

(54) FERROELECTRONIC MEMORY AND ELECTRONIC APPARATUS

(75) Inventors: Takamitsu Higuchi, Suwa (JP); Setsuya Iwashita, Suwa (JP); Hiromu Miyazawa, Suwa (JP); Kazumasa Hasegawa, Suwa (JP); Eiji Natori, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/105,042

(22) Filed: Mar. 22, 2002

(65) Prior Publication Data

US 2002/0155667 A1 Oct. 24, 2002

(30) Foreign Application Priority Data

Mar. 15, 2002 (JP) ........................................ 2002-073092
Mar. 26, 2003 (JP) ........................................ 2001-088843

(51) Int. Cl.$^7$ ........................ H01C 31/119; G11C 11/22
(52) U.S. Cl. ........................ 257/295; 257/300; 257/906; 257/306; 365/145
(58) Field of Search ................................. 257/295, 300, 257/306, 906, 296, 307, 311, 533, 535, 293; 365/145; 438/3

(56) References Cited

U.S. PATENT DOCUMENTS

| 5,060,191 | A | * | 10/1991 | Nagasaki et al. | ........... | 365/145 |
| 5,561,307 | A | * | 10/1996 | Mihara et al. | ............... | 257/295 |
| 5,889,299 | A | * | 3/1999 | Abe et al. | ................... | 257/295 |
| 5,986,298 | A | | 11/1999 | Yoo | | |
| 6,077,716 | A | | 6/2000 | Yoo | | |
| 6,225,656 | B1 | * | 5/2001 | Cuchiaro et al. | ........... | 257/295 |
| 2002/0044480 | A1 | * | 4/2002 | Gudesen et al. | ............ | 365/145 |

FOREIGN PATENT DOCUMENTS

| JP | 08-273371 | 10/1996 |
| JP | 09-116107 | 5/1997 |
| JP | 09-128960 | 5/1997 |
| JP | 2002-026285 | 1/2002 |

* cited by examiner

*Primary Examiner*—Jerome Jackson
(74) *Attorney, Agent, or Firm*—Harness, Dickey & Pierce, P.L.C.

(57) ABSTRACT

The present invention relates to a ferroelectric memory having a matrix-type memory cell array which has an excellent degree of integration, in which the angularity of the ferroelectric layer's hysteresis curve is improved. A ferroelectric memory having both integration and memory characteristics in which the angularity of the ferroelectric layer's hysteresis curve is improved is realized as follows. Namely, a structure is employed in which the memory cell array and the peripheral circuit are in a plane separated from one another, and the ferroelectric layer is made to undergo epitaxial growth on to a Si single crystal via a buffer and the first signal electrodes.

18 Claims, 4 Drawing Sheets

FERROELECTRONIC MEMORY AND ELECTRONIC APPARATUS

BACKGROUND OF THE INVENTION

1. Field of the Invention

The present invention relates to a ferroelectric memory, and more specifically to a simple matrix-type ferroelectric memory that uses only a ferroelectric capacitor and does not have a cell transistor. The present invention further relates to an electronic apparatus equipped with this ferroelectric memory.

2. Description of Related Art

Ferroelectric memory has undergone rapid development in recent years as a form of nonvolatile memory employing a ferroelectric substance. Typically, a ferroelectric capacitor is formed by employing an oxidized ferroelectric material as the capacitor insulating film, and is used as a non-volatile memory by storing data according to the polarization direction of the ferroelectric capacitor.

In the usual ferroelectric memory, the peripheral circuit for selectively carrying out the writing and reading out of data to and from a memory cell and the memory cell are formed in close proximity to one another. A single cell therefore has a large area, making it difficult to improve the degree of integration in the memory cell and increase the memory capacity.

In order to achieve greater integration and higher capacity, a ferroelectric memory was therefore proposed in which a memory cell array is formed that is composed of first signal electrodes having of strip-type electrodes disposed in parallel, second signal electrodes disposed in parallel and in a direction which is perpendicular to the direction of the rows of first signal electrodes, and a ferroelectric layer disposed in between the aforementioned first and second signal electrodes at the areas of intersection therebetween, wherein the memory cells in this memory cell array are arranged in the form of a matrix (see Japanese Patent Application, First Publication No. Hei 9-128960).

When a voltage is impressed on a given selected cell in a ferroelectric memory composed of this type of memory cell array, however, a voltage is also impressed on non-selected cells. In order to minimize this effect, a method has been proposed in which a voltage Va is impressed on the selected cell and a voltage Va/3 or −Va/3 is impressed on non-selected cells, this method being accomplished by impressing, for example, a voltage Va on the selected first signal electrode, a voltage Va/3 on the nonselected first signal electrodes, a voltage 0 on the selected second signal electrode, and a voltage 2Va/3 on the non-selected second signal electrodes (see Japanese Patent Application, First Publication No. Hei 9-128960). Accordingly, a domain inversion must occur at Va but must not occur at Va/3 in the ferroelectric layer. In other words, the polarization-electric field (P-E) hysteresis curve must have angularity.

In the usual ferroelectric memory design, the memory cell portion is formed on top of a $SiO_2$ protecting layer that is formed on the peripheral circuit that contains the MOS transistor. It is therefore not possible to control the orientation of the ferroelectric layer, and so, the angles that are formed by the impressed electric fields and the polarization axes of each crystal grain vary from one another. As a result, variation also arises in the voltage impressed when each crystal grain undergoes domain inversion, which leads to problematic deterioration in the angularity of the hysteresis curve.

BRIEF SUMMARY OF THE INVENTION

Hereafter, also in the embodiments and claims, numerals accompanied by the parenthesis like (010) or (100) indicate the condition of orientation such as disposing direction of the single crystal or the like.

It is therefore the objective of the present invention to provide a ferroelectric memory which is provided with both integration and memory characteristics by improving the angularity of the ferroelectric layer's hysteresis curve, this objective being accomplished by employing a structure in which the memory cell array and the peripheral circuit are disposed in a plane separated from one another, and the memory cell array is subjected to epitaxial growth on a Si single crystal. It is a further objective of the present invention to provide an electronic apparatus equipped with this ferroelectric memory.

The ferroelectric memory is characterized by a structure in which:

a memory cell array is disposed on a Si single crystal substrate, the memory cell array consisting of first signal electrodes and second signal electrodes disposed facing and perpendicular to each other, and a ferroelectric layer held in between the first signal electrodes and the second signal electrodes, wherein the regions of intersection between the first signal electrodes and the second signal electrodes that include the ferroelectric layer are disposed in the form of a matrix for employment as memory cells; and a peripheral circuit that includes a MOS transistor for selecting the memory cells is disposed on the Si single crystal substrate in a plane separated from the memory cell array;

and wherein the first signal electrodes undergo epitaxial growth on the Si single crystal substrate via a buffer layer, and the ferroelectric layer undergoes epitaxial growth on the first signal electrodes.

By exploiting the fact that the memory cell array and the peripheral circuit are disposed in a plane separated from one another in the above structure, the memory cells can be made to undergo epitaxial growth directly on the Si single crystal. As a result, it is possible to realize a ferroelectric memory in which there is improved angularity in the ferroelectric layer's hysteresis curve, and which is provided with both integration and memory characteristics.

The ferroelectric memory is also characterized in that, in the above ferroelectric memory the ferroelectric layer is composed of an oxidized ferroelectric material having a perovskite structure, or an oxidized ferroelectric material having a Bi layered perovskite structure.

The above structure is effective in obtaining a ferroelectric memory provided with both integration and memory characteristics by employing an oxidized ferroelectric material having a perovskite structure or an oxidized ferroelectric material having a Bi layered perovskite structure, by means of which impressive developments in memory characteristics have been achieved in recent years.

The ferroelectric memory is also characterized in that, in the above the ferroelectric memory the Si single crystal substrate is a (100) substrate; the buffer layer includes one of either titanium nitride (TiN) or a metal oxide MO (M=Mg, Ca, Sr, Ba) which has NaCl structure and are (100)-oriented or (110)-oriented in cubic system; and the first signal electrodes include one of either metal platinum Pt which is (100)-oriented in cubic system or a conductive oxide which has a perovskite structure and are (100)-oriented in cubic system or (100)-oriented in pseudo-cubic system.

By making the first signal electrodes which is (100)-oriented in cubic system or in pseudo-cubic system undergo epitaxial growth on the (100) Si single crystal substate, the above structure has the effect of causing the ferroelectric layer to undergo epitaxial growth on to the first signal electrodes.

The ferroelectric memory is also characterized in that, in the above ferroelectric memory the ferroelectric layer has a polarization moment in the (001) direction in tetragonal system, and is composed of an oxidized ferroelectric material having a (001)-oriented perovskite structure.

By means of the above structure, a ferroelectric layer containing a representative ferroelectric substance, PZT ($PbZr_xTi_{1-x}O_3$), can be made to undergo epitaxial growth at a (001) orientation in tetragonal system on a (100) Si single crystal substrate, which has the effect of providing a ferroelectric memory having good angularity.

The ferroelectric memory is also characterized in that, in the above ferroelectric memory the Si single crystal substrate is a (10) substrate; the buffer layer includes one of either titanium nitride (TiN) or a metal oxide MO (M=Mg, Ca, Sr, Ba) which has a NaCl structure and are (110)-oriented in cubic system; and the first signal electrodes include one of either a metal platinum Pt which is (110)-oriented in cubic system or a conductive oxide which has a perovskite structure and are (110)-oriented in cubic system or (110)-oriented in pseudo-cubic system.

By causing the first signal electrodes which is (110)-oriented in cubic system or in pseudo-cubic system to undergo epitaxial growth on the (110) Si single crystal substate, the above structure has the effect of causing the ferroelectric layer to undergo epitaxial growth on to the first signal electrodes.

The ferroelectric memory is also characterized in that, in the above ferroelectric memory the ferroelectric layer is composed of a oxidized ferroelectric material having a Bi layered perovskite structure that has a polarization moment in the a or b axis direction in a tetragonal or orthorhombic.

By means of the above structure, a ferroelectric layer containing a representative ferroelectric substance SBT ($SrBi_2Ta_2O_9$) can be made to undergo epitaxial growth on a (110) Si single crystal substrate, which has the effect of providing a ferroelectric memory having good angularity.

The ferroelectric memory is also characterized in that, in the above ferroelectric memory the Si single crystal substrate is a (111) substrate; the buffer layer includes one of either titanium nitride (TiN) or a metal oxide MO (M=Mg, Ca, Sr, Ba) which has a NaCl structure and are (111)-oriented in cubic system; and the first signal electrode includes one of either a metal platinum Pt which is (111)-oriented in cubic system or a conductive oxide which has a perovskite structure and are (111)-oriented in cubic system of (111)-oriented in pseudo-cubic system.

By making first signal electrodes which is (111)-oriented in cubic system or pseudo-cubic undergo epitaxial growth on the (111) Si single crystal substate, the above structure has the effect of causing the ferroelectric layer to undergo epitaxial growth on to the first signal electrodes.

The ferroelectric memory is also characterized in that, in the above ferroelectric memory the ferroelectric layer is composed of an oxidized ferroelectric material having a polarization moment in the (111) direction in rhombohedral system and a (111)-oriented perovskite structure, or an oxidized ferroelectric material having a Bi layered perovskite structure which has a polarization moment in the a or b axis direction in a tetragonal or orthorhombic system.

By means of the above structure, a ferroelectric layer containing a representative ferroelectric substance PZT ($PbZr_xTi_{1-x}O_3$) or SBT ($SrBi_2Ta_2O_9$) can be made to undergo epitaxial growth on a (111) Si single crystal substrate, which has the effect of providing a ferroelectric memory having good angularity.

The ferroelectric memory of the present invention is also characterized in that, in the above ferroelectric memory the Si single crystal substrate is a (100) substrate, the buffer layer includes at least one of a cerium oxide $CeO_2$ or yttrium stabilized zirconia YSZ having a fluorite structure and are (100)-oriented in cubic system, and the first signal electrodes include at least one of a metal platinum Pt which is (110)-oriented in cubic system or a conductive oxide having a perovskite structure and are (110)-oriented in cubic system or (110)-oriented in pseudo-cubic system.

By causing first signal electrodes which is (110)-oriented in cubic system or pseudo-cubic system to undergo epitaxial growth on the (100) Si single crystal substate, the above structure is effective in causing the ferroelectric layer to undergo epitaxial growth on top of the first signal electrodes.

The ferroelectric memory is also characterized in that, in the above ferroelectric memory the ferroelectric layer is composed of an oxidized ferroelectric material having a Bi layered perovskite structure which has a polarization moment in the a axis or the b axis direction in a tetragonal or orthorhombic system.

By means of the above structure, it is possible to cause a ferroelectric layer containing a representative ferroelectric substance, SBT ($SrBi_2Ta_2O_9$), to undergo epitaxial growth on a (100) Si single crystal substrate, which is effective in obtaining a ferroelectric memory having good angularity.

The electronic apparatus of the present invention is characterized in the provision of a ferroelectric memory according to one of the above.

By providing a ferroelectric memory having both integration and memory characteristics in the above structure, it is possible to provide an electronic apparatus which is highly reliable and small in size.

BRIEF DESCRIPTION OF THE DRAWING

FIG. 6 is a view showing examples of electronic apparatuses equipped with a ferroelectric memory.

PREFERRED EMBODIMENTS OF THE PRESENT INVENTION

Preferred embodiments of the present invention will now be explained based on the accompanying drawings.

First Embodiment

Device

Figure 1:
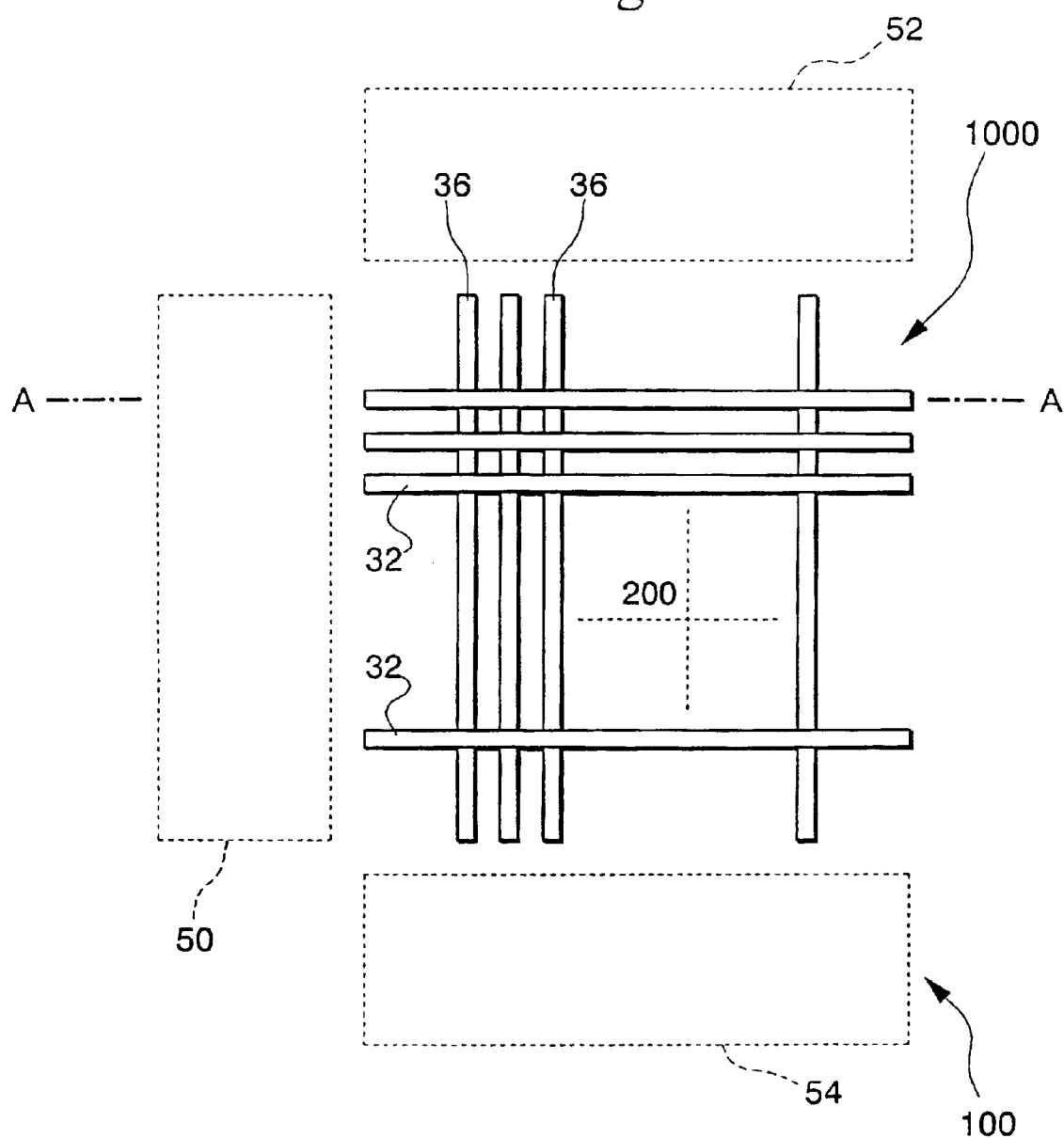
FIG. 1 is a plan view schematically showing the ferroelectric memory according to the first embodiment of the present invention.
Figure 2:
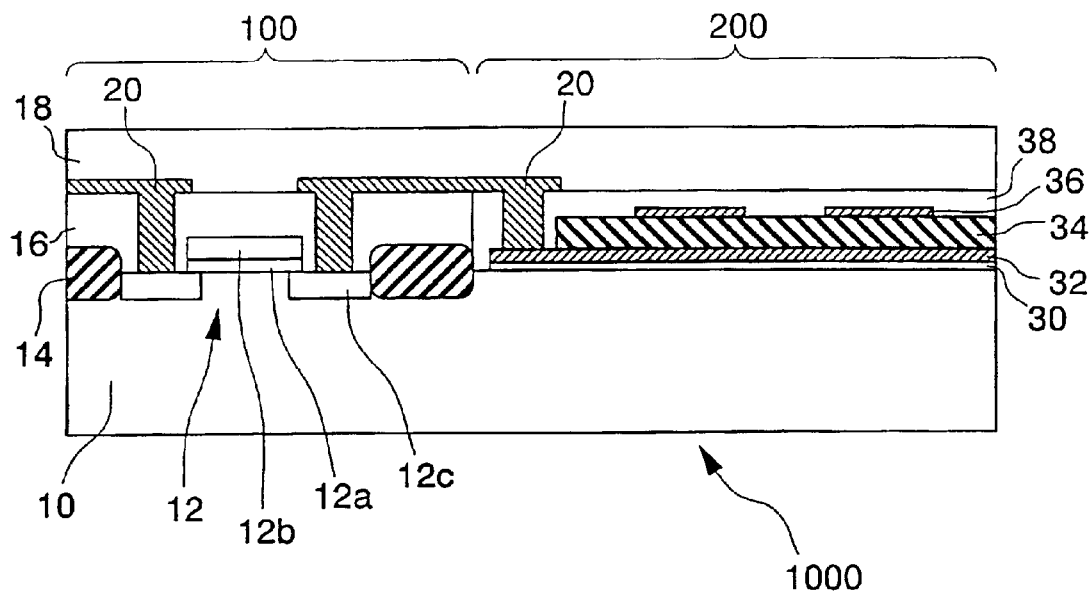
FIG. 2 is a cross section schematically showing a portion of the ferroelectric memory along the line A—A in FIG. 1.

FIG. 1 is a plan view schematically showing the ferroelectric memory according to the present embodiment. FIG. 2 is a cross section schematically showing a portion of the ferroelectric memory along the line A—A indicated in FIG. 1.

Ferroelectric memory 1000 according to the present embodiment has a memory cell array 200 and a peripheral circuit 100. Memory cell array 200 and peripheral circuit 100 are formed in a plane separated from one another.

In memory cell array 200, first signal electrodes (word line) 32 for row selection and second signal electrodes (bit line) 36 for column selection are disposed so as to be perpendicular to each another. The reverse scenario is also acceptable, i.e., it is also acceptable for the first signal electrodes to be the bit lines and the second signal electrodes to be the word lines. Also, as shown in FIG. 2, a ferroelectric layer 34 is disposed in between first signal electrodes 32 and second signal electrodes 36. Accordingly, memory cells consisting of respective ferroelectric capacitors are formed at the regions of intersection between first signal electrodes 32 and second signal electrodes 36. First signal electrodes 32 and ferroelectric layer 34 undergo epitaxial growth on Si single crystal substrate 10 via a buffer layer 30. Second signal electrodes 36 do not need to undergo epitaxial growth. A protecting layer 38 consisting of an insulating layer is formed so as to cover second signal electrodes 36, and an insulating superficial protecting layer 18 is formed on this protecting layer 38. First signal electrodes 32 and second signal electrodes 36 are electrically connected respectively with peripheral circuit 100 via circuit layers 20.

As shown in FIG. 1, peripheral circuit 100 contains all types of circuits necessary for selectively carrying out data write or read operations to and from the memory cells. Peripheral circuit 100 includes, for example, a first drive circuit 50 for selectively controlling first signal electrodes 32, second drive circuit 52 for selectively controlling second signal electrodes 36, and a signal detection circuit 54 such as a sense amp or the like.

As shown in FIG. 2, peripheral circuit 100 includes MOS transistors 12 which are formed on Si single crystal substrate 10. MOS transistor 12 has a gate insulating film 12*a*, gate electrode 12*b*, and source/drain region 12*c*. Each MOS transistor 12 is separated by an element separating region 14. Interlayer insulating layer 16 is formed to Si single crystal substrate 10 on which MOS transistor 12 is formed. In addition, each MOS transistor 12 is electrically connected by wiring layer 20 which is formed with a predetermined pattern. Superficial protecting layer 18 is formed on wiring layer 20. Peripheral circuit 100 and memory cell array 200 are electrically connected by wiring layer 20.

Next, an example of the write to and read out operations at ferroelectric memory 1000 according to this embodiment will be discussed.

In the read out operation, a read out voltage V0 is impressed on the selected cell. The impression of voltage V0 on the selected cell is also a writing operation of "0 (zero)". The current running through the selected bit line or the potential when high impedance is applied to the bit line is read out at sense amp. In order to avoid cross-talk during read out, a predetermined voltage is impressed at the non-selected cells.

When writing a "1" during the write to operation, a voltage −V0 is impressed on the selected cell. When writing a "0", a voltage is impressed which does not cause a domain inversion at the selected cell and maintains the '0' state that was written during the read out operation. In order to avoid cross-talk during write to operations, a predetermined voltage is impressed at the capacitor of the non-selected cells.

(Manufacturing Method of Device)

Figure 3:
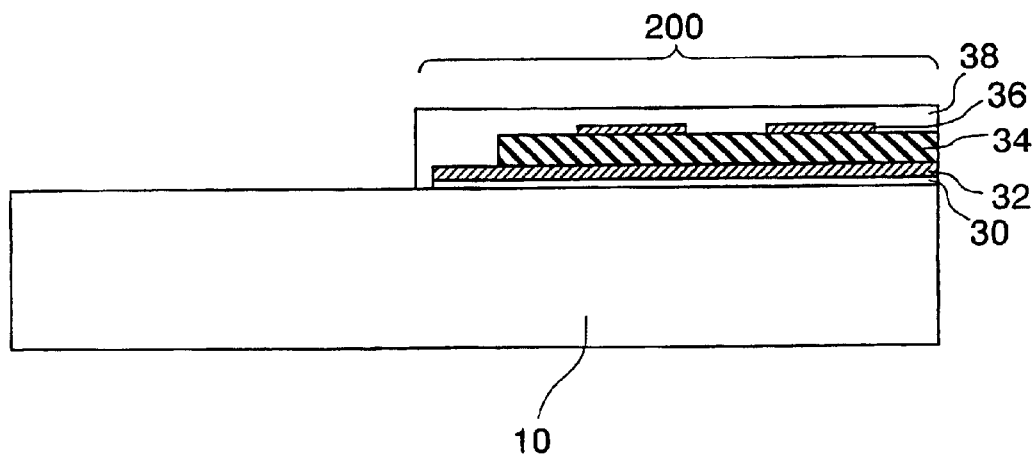
FIG. 3 is a cross section schematically showing the steps for producing the ferroelectric memory shown in FIGS. 1 and 2.
Figure 4:
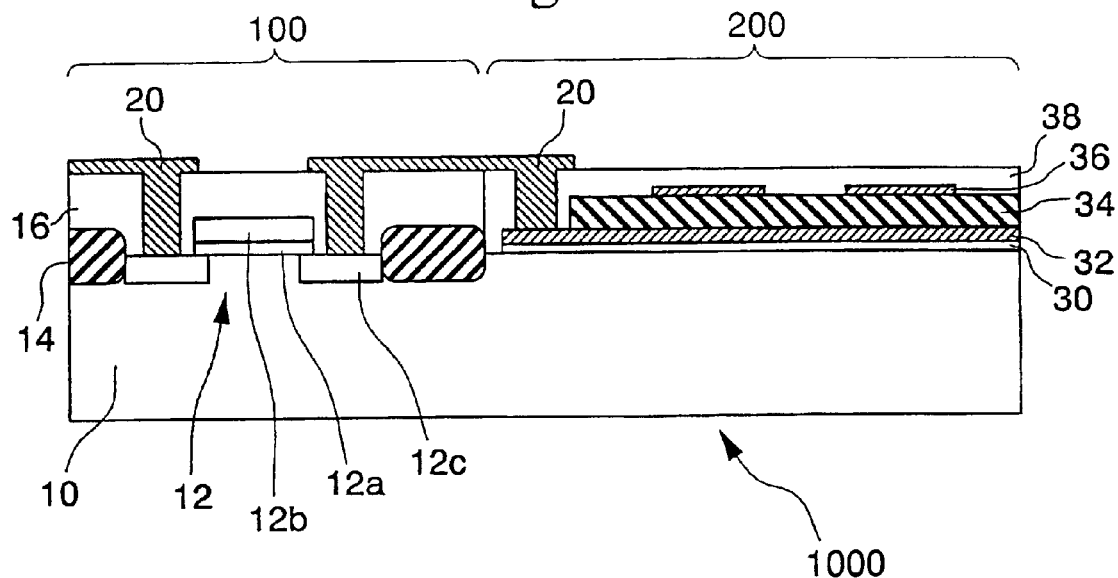
FIG. 4 is a cross section schematically showing the steps for producing the ferroelectric memory shown in FIGS. 1 and 2.

Next, an example of the method for producing the above-described ferroelectric memory will be discussed. FIGS. 3 and 4 are cross sections schematically showing the steps for producing ferroelectric memory 1000.

As shown in FIG. 3, a memory cell array 200 is first formed on a Si single crystal substrate 10. Specifically, first signal electrodes 32 which are arrayed in a predetermined pattern on Si single crystal substrate 10 are made to undergo epitaxial growth via buffer layer 30. Next, ferroelectric layer 34 is formed on to Si single crystal substrate 10 on which first signal electrodes 32 are formed. The ferroelectric layer 34 that is formed on Si single crystal substrate 10 does not undergo epitaxial growth, while the ferroelectric layer 34 that is formed on first signal electrodes 32 does undergo epitaxial growth. Second signal electrodes 36 which are arrayed in a predetermined pattern are formed on ferroelectric layer 34. Next, a protecting layer 38 consisting of an insulating layer is formed on top of ferroelectric layer 34 on which second signal electrodes 36 are formed.

Next, as shown in FIG. 4, a conventionally known LSI process is employed to form a peripheral circuit at a position which is separated from but in the same plane as memory cell array 200. Specifically, MOS transistors 12 are formed on top of Si single crystal substrate 10. For example, an element separating region 14 is formed using a trench separating method or LOCOS method at a predetermined region on Si single crystal substrate 10. Next, a gate insulating film 12*a* and a gate electrode 12*b* are formed, after which a source/drain region 12*c* is formed by doping impurities in Si single crystal substrate 10. Next, after forming an interlayer insulating layer 16, a contact hole is formed that includes the memory cell array 200 region. Then, a wiring layer 20 having a predetermined pattern is formed. Finally, a superficial protecting layer 18 is formed on top of protecting layer 38 and interlayer insulating layer 16 on which wiring layer 20 is formed. Peripheral circuit 100 and memory cell array 200 are thereby formed in this manner.

MO (M=Mg, Ca, Sr, Ba), TiN, YSZ, and $CeO_2$ may be cited as examples of the material employed for buffer layer 30. Buffer layer 30 may be a signal layer or may be multiple layers in a layered construction. A conventionally known method typically used for epitaxial growth, such as laser ablation, MOCVD, molecular beam epitaxy or the like, may be employed as the film forming method.

$MRuO_3$ (M=Ca, Sr, Ba), $La_{1-x}Sr_xVO_3$, $La_{1-x}Sr_xMnO_3$, $La_{1-x}Sr_xCoO_3$ or Pt may be cited as examples of materials which may be used for first signal electrodes 32. First signal electrode 32 may be a signal layer or may be multiple layers in a layered construction. A conventionally known method typically used for epitaxial growth, such as laser abrasion, MOCVD, molecular beam epitaxy or the like, may be employed as the film forming method.

PZT ($PbZr_xTi_{1-x}O_3$) and SBT ($SrBi_2Ta_2O_9$) may be cited as examples of the material for ferroelectric layer 34. A conventionally known method typically used for epitaxial growth, such as laser ablation, MOCVD, molecular beam epitaxy or the like may be employed as the film forming method.

The material employed for second signal electrodes 36 is not particularly restricted, with Ir, $IrO_x$, Ru, and $RuO_x$ being cited as examples in addition to those materials already mentioned for first signal electrodes 32. Second signal electrode 36 may be a signal layer or may be multiple layers in a layered construction.

In a ferroelectric memory of the above-described structure, memory cell array 200 can be made to undergo epitaxial growth separated away from peripheral circuit 100 on a single Si single crystal substrate, the memory cell's degree of integration can be maintained, and the angularity of the ferroelectric layer's hysteresis curve can be improved.

Here, regarding the orientation direction of Si single crystal substrate 10, buffer layer 30, first signal electrode 32, ferroelectric layer 34, when Si single crystal substrate 10 is a substrate (100), and the buffer layer 30 includes MO (M=Mg, CA, Sr, Ba) or TiN which is (100)-oriented in cubic system, the first signal electrode 32 is (100)-oriented in cubic system or (100)-oriented in pseudo-cubic system, and the ferroelectric layer 34 such as PZT is for example (001)-oriented in tetragonal system. Also, when Si single crystal substrate 10 is a substrate (110), and the buffer layer 30 includes MO (M=Mg, CA, Sr, Ba) or TiN which is (110)-oriented in cubic system, the first signal electrode 32 is (110)-oriented in cubic system or (110)-oriented in pseudo-cubic system, and the ferroelectric layer 34 such as SBT is for example (116)-oriented in orthorhombic system. Also, when Si single crystal substrate 10 is a substrate (111), and the buffer layer 30 includes MO (M=Mg, CA, Sr, Ba) or TiN which is (111)-oriented in cubic system, the first signal electrode 32 is (111)-oriented in cubic system or (111)-oriented in pseudocubic system, and the ferroelectric layer 34 such as PZT is for example (111)-oriented in rhombohedral system, or the ferroelectric layer 34 such as SBT of is (103)-oriented in orthorhombic system. Also, when Si single crystal substrate 10 is a substrate (100), and the buffer layer 30 includes YSZ or $CeO_2$ which is (100)-oriented in cubic system, the first signal electrode 32 is (110)-oriented in cubic system or (110)-oriented in pseudo-cubic system, and the ferroelectric layer 34 such as SBT is for example (116)-oriented in orthorhombic system.

Second Embodiment

Figure 5:
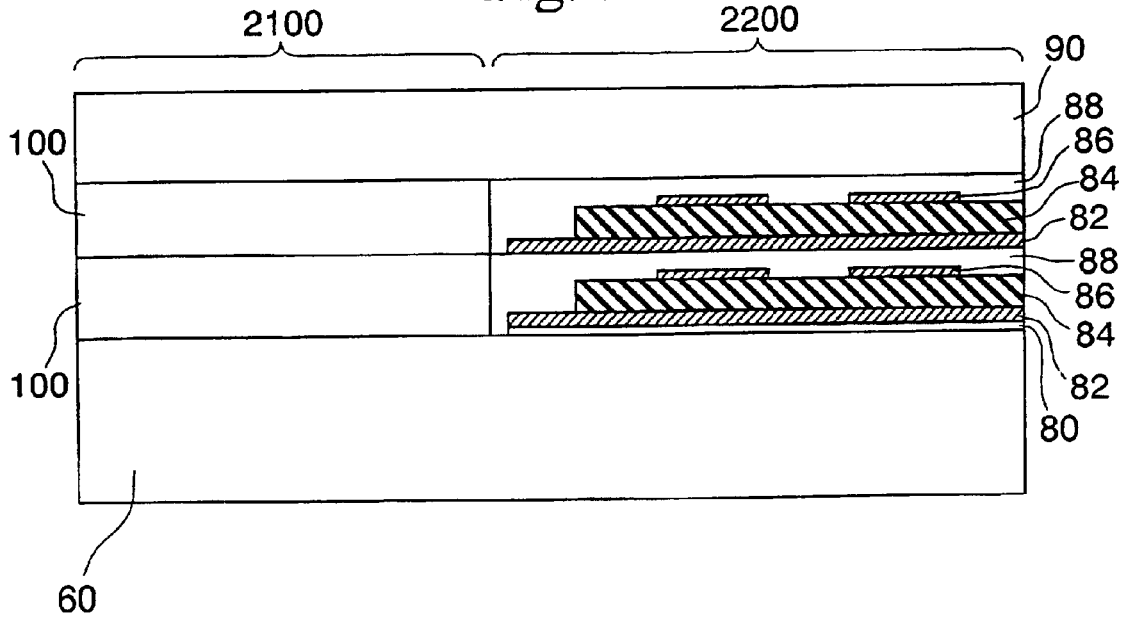
FIG. 5 is a cross section schematically showing the ferroelectric memory according to the second embodiment of the present invention.

FIG. 5 is a cross section schematically showing the ferroelectric memory according to this embodiment.

The ferroelectric memory 2000 according to this embodiment is composed of a peripheral circuit layer 2100 in which peripheral circuit 100 is layered on top of Si single crystal substrate 60 and memory cell array layer 2200 in which the memory cell array is layered.

In memory cell array layer 2200, buffer layer 80 is formed on Si single crystal substrate 60, then first signal electrode 82 is formed thereon, and ferroelectric layer 84, second signal electrode 86 and insulating layer 88 are formed thereon one by one in such order, with the components from first signal electrode 82 through protecting layer 88 being repeated in sequence in the structure. If the same material used for the first signal electrodes is employed in the second signal electrodes, and protecting layer 88 is made from an insulating material with a perovskite structure, such as $SrTiO_3$, then it becomes possible to cause epitaxial growth from Si single crystal substrate 60 through to protecting layer 88 which is directly under superficial protecting layer 90 at the regions of intersection between the first signal electrodes and the second signal electrodes.

In a ferroelectric memory having the structure described above, memory cell array layer 2200 can be made to undergo epitaxial growth separated from peripheral circuit layer 2100 on a single Si single crystal substrate 60, the angularity of the ferroelectric layer's hysteresis curve can be improved, and the integration of the memory cell can be increased.

Next, an example of an electronic apparatus employing a ferroelectric memory according to the above embodiment will be explained.

Figure 6A:
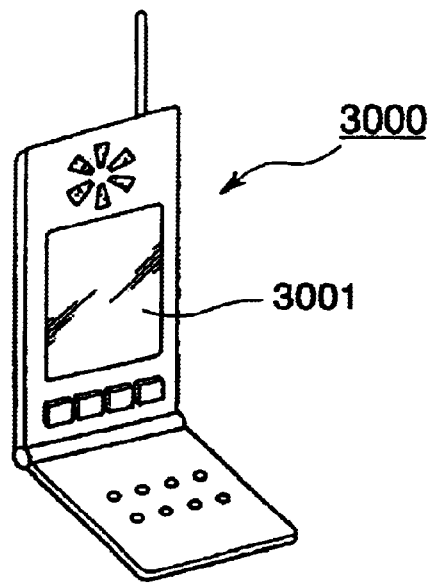
FIGS. 6A to 6C are perspective views of a cellular telephone, a wristwatch type electronic apparatus and a portable information processing device, respectively.

FIG. 6A is a perspective view showing an example of a cellular telephone. In FIG. 6A, the reference numeral 3000 indicates the main body of a cellular telephone. Memory portion 3001 which employs the above-described ferroelectric memory is provided inside cellular telephone 1000.

Figure 6B:
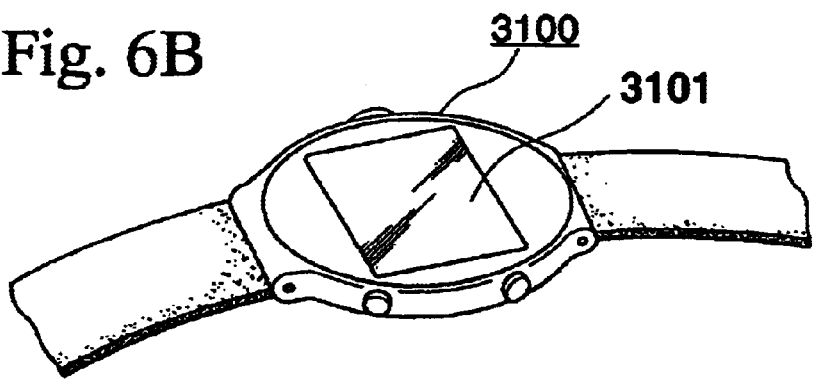

FIG. 6B is a perspective view showing an example of a wristwatch type electronic apparatus. In FIG. 6B, the reference numeral 3100 indicates the main body of a wristwatch. Memory portion 3101 which employs the above-described ferroelectric memory is provided inside wristwatch 3100.

Figure 6C:
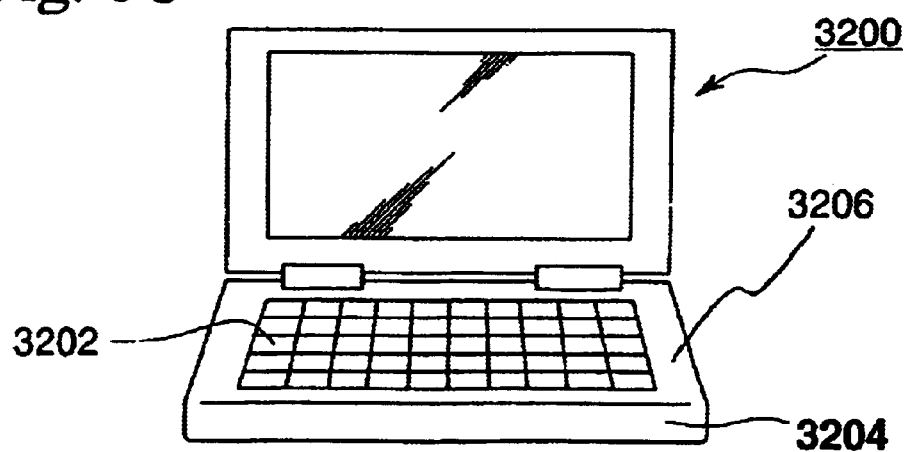

FIG. 6C is a perspective view showing an example of a portable data processing device such as a word processor, personal computer or the like. In FIG. 6C, the reference numeral 3200 indicates an information processing device, 3202 indicates the input portion such as a keyboard, and 3204 indicates the main body of the information processing device. Memory portion 3206 which employs the above-described ferroelectric memory is provided inside device 3200.

Although not shown in the drawings., as another example of an electronic device, the present invention can also be employed in so-called IC cards provided with a memory portion that employs the above-described ferroelectric memory in the card, for example.

The electronic apparatuses (including IC cards) shown in FIGS. 6A to 6C are provided with a ferroelectric memory having both integration and memory characteristics as described by the preceding embodiments. As a result, it is possible to realize electronic devices that are highly reliable and small in size.

The technical scope of the present invention is not limited to the preceding embodiments. Rather, a variety of modifications may be applied, provided that they are within a scope that does not fall outside the essential intent of the present invention.

For example, the above-described ferroelectric memory can also be employed in a so-called 1T1C type memory cell formed of one MOS transistor and one capacitor, or a so-called 2T2C memory cell formed of two MOS transistors and two capacitors.

As described above, by means of the present invention's ferroelectric memory, it is possible in a ferroelectric memory having a matrix-type memory cell array which has an excellent degree of integration to cause a memory cell to undergo direct epitaxial growth on to a Si single crystal by employing a structure in which the memory cell array and the peripheral circuit are disposed in a plane separated from one another. As a result, a ferroelectric memory can be realized in which the angularity of the ferroelectric layer's hysteresis curve is improved, and which has both integration and memory characteristics. Moreover, the present invention also enables provision of highly reliable, small electronic devices.

The entire disclosure of Japanese Patent Application Nos. 2001-088843 filed Mar. 26, 2001 and 2002-073092 filed Mar. 15, 2002 are incorporated by reference.

What is claimed:

1. A ferroelectric memory comprising:
   a mounting base composed of a Si single crystal substrate, said single crystal substrate being a (100) substrate;
   a memory cell array disposed on said mounting base and comprising first signal electrodes and second signal electrodes which are disposed facing and perpendicular to each other;

a ferroelectric layer disposed between said first signal electrode and said second signal electrode, wherein regions of intersection between said first signal electrodes and said second signal electrodes that include said ferroelectric layer are disposed in a matrix form for employment as memory cells;

a peripheral circuit including a MOS transistor which selects said memory cell, said circuit being disposed horizontally separated from said memory cell array on said Si single crystal substrate; and a buffer layer disposed on said Si single crystal substrate, said buffer layer including either a metal oxide MO (M=Mg, Ca, Sr, Ba) or a titanium nitride (TiN); and wherein said first signal electrodes are located on said buffer layer and are epitaxially grown electrodes that include either a conductive oxide having a perovskite structure that is (100)-oriented in a cubic system or (100)-oriented in a pseudo-cubic system, or a metal platinum Pt that is (100)-oriented in a cubic system; and said ferroelectric layer is an epitaxially grown ferroelectric layer.

2. A ferroelectric memory according to claim 1, wherein said ferroelectric layer is composed of an oxidized ferroelectric material having a perovskite structure, or an oxidized ferroelectric material having a Bi layered perovskite structure.

3. A ferroelectric memory according to claim 1, wherein said ferroelectric layer has a polarization moment in the (001) tetragonal direction and is composed of an oxidized ferroelectric material having perovskite structure and being (100)-oriented.

4. A ferroelectric memory comprising:

a mounting base composed of a Si single crystal substrate, said Si single crystal substrate is a (110) substrate;

a memory cell array disposed on said mounting base and comprising first signal electrodes and second signal electrodes which are disposed facing and perpendicular to each other;

a ferroelectric layer disposed between said first signal electrode and said second signal electrode, wherein regions of intersection between said first signal electrodes and said second signal electrodes that include said ferroelectric layer are disposed in a matrix form for employment as memory cells;

a peripheral circuit including a MOS transistor which selects said memory cell, said circuit being disposed horizontally separated from said memory cell array on said Si single crystal substrate; and a buffer layer disposed on said Si single crystal substrate, the buffer layer including either a metal oxide MO (M=Mg, Ca, Sr, Ba) or a titanium nitride (TiN); and wherein the metal oxide MO (M=Mg, Ca, Sr, Ba) and the titanium nitride (TiN) have an NaCl structure and are (110)-oriented in a cubic system;

the first signal electrodes include either a conductive oxide having a peroyskite structure that is (110)-oriented in a cubic system or (110)-oriented in a pseudo-cubic system, or a metal platinum Pt that is (110)-oriented in a cubic system.

5. A ferroelectric memory according to claim 4, wherein said ferroelectric layer is composed of an oxidized ferroelectric material having a Bi layered perovskite structure that has a polarization moment in the a or b axis direction in a tetragonal or orthorhombic.

6. A ferroelectric memory comprising:

a mounting base composed of a Si single crystal substrate, said Si single crystal substrate is a (111) substrate;

a memory cell array disposed on said mounting base and comprising first signal electrodes and second signal electrodes which are disposed facing and perpendicular to each other;

a ferroelectric layer disposed between said first signal electrode and said second signal electrode, wherein regions of intersection between said first signal electrodes and said second signal electrodes that include said ferroelectric layer are disposed in a matrix form for employment as memory cells;

a peripheral circuit including a MOS transistor which selects said memory cell, said circuit being disposed horizontally separated from said memory cell array on said Si single crystal substrate; and a buffer layer disposed on said Si single crystal substrate, the buffer layer including either a metal oxide MO (M=Mg, Ca, Sr, Ba) or a titanium nitride (TIN); and wherein the metal oxide MO (M=Mg, Ca, Sr, Ba) and the titanium nitride (TiN) have an NaCl structure and are (111)-oriented in a cubic system;

the first signal electrodes include either a conductive oxide having a perovskite structure that is (111)-oriented in a cubic system or (111)-oriented in a pseudo-cubic system, or a metal platinum Pt (111)-oriented in a cubic system.

7. A ferroelectric memory according to claim 6, wherein said ferroelectric layer is composed of an oxidized ferroelectric material having a polarization moment in the (111) rhombohedral direction and a (111)-oriented perovskite structure, or an oxidized ferroelectric material having a Bi layered perovskite structure which has a polarization moment in the a or b axis direction in a tetragonal or orthorhombic.

8. A ferroelectric memory comprising:

a mounting base composed of a Si single crystal substrate, said Si single crystal substrate is a (100) substrate;

a memory cell array disposed on said mounting base and comprising first signal electrodes and second signal electrodes which are disposed facing and perpendicular to each other;

a ferroelectric layer disposed between said first signal electrode and said second signal electrode, wherein regions of intersection between said first signal electrodes and said second signal electrodes that include said ferroelectric layer are disposed in a matrix form for employment as memory cells;

a peripheral circuit including a MOS transistor which selects said memory cell, said circuit being disposed horizontally separated from said memory cell array on said Si single crystal substrate; and a buffer layer disposed on said Si single crystal substrate, the buffer layer including either yttrium stabilized zirconia YSZ or a cerium oxide $CeO_2$; and wherein the yttrium stabilized zirconia YSZ and the cerium oxide $CeO_2$ have a fluorite structure and are (100)-oriented in a cubic system;

the first signal electrodes include either a conductive oxide having a perovskite structure that is (110)-oriented in a cubic system or (110)-oriented in a pseudo-cubic system, or a metal platinum Pt (110)-oriented in a cubic system.

9. A ferroelectric memory according to claim 8 wherein said ferroelectric layer is composed of an oxidized ferroelectric material having a Bi layered perovskite structure which has a polarization moment in the a axis or the b axis direction in a tetragonal or orthorhombic.

10. An electronic apparatus characterized in the provision of a ferroelectric memory according to claim 1.

11. An electronic apparatus characterized in the provision of a ferroelectric memory according to claim 2.

12. An electronic apparatus characterized in the provision of a ferroelectric memory according to claim 3.

13. An electronic apparatus characterized in the provision of a ferroelectric memory according to claim 4.

14. An electronic apparatus characterized in the provision of a ferroelectric memory according to claim 5.

15. An electronic apparatus characterized in the provision of a ferroelectric memory according to claim 6.

16. An electronic apparatus characterized in the provision of a ferroelectric memory according to claim 7.

17. An electronic apparatus characterized in the provision of a ferroelectric memory according to claim 8.

18. An electronic apparatus characterized in the provision of a ferroelectric memory according to claim 9.

* * * * *

UNITED STATES PATENT AND TRADEMARK OFFICE
CERTIFICATE OF CORRECTION

PATENT NO. : 6,737,690 B2
APPLICATION NO. : 10/105042
DATED : May 18, 2004
INVENTOR(S) : Takamitsu Higuchi It is certified that error appears in the above-identified patent and that said Letters Patent is hereby corrected as shown below:

Title Page, (30) Foreign Application Priority:
"Mar. 26, 2003 (JP) 2001-088843" should be: --Mar. 26, 2001 (JP) 2001-088843--

Title Page: Term of patent should not extend beyond the expiraton of USSN 10/105,002 filed 3/22/2002.

Col. 1, line 32: Delete "of".

Col. 2, line 58: Delete second occurrence of "the".

Col. 3, line 19: "(10)" should be -- (110) --.

Col. 3, line 35: "a" should be -- an --.

Col. 3, line 52: "of" should be -- or --.

Col. 4, line 43: "DRAWING" should be -- DRAWINGS --.

Col. 7, line 31: Delete "of".

Col. 9, line 56: "NaCl" should be -- NaC1 --.

Col. 9, line 67: After "orthorhombic" insert -- system --.

Col. 10, line 20: "(TIN)" should be -- (TiN) --.

Col. 10, line 22: "NaCl" should be -- NaC1 --.

Col. 10, line 32: "rhombohedral direction and a" should be -- direction in a rhombodedral system and an --.

Col. 10, line 35: "the" should be -- an --.

Col. 10, line 36: After "orthorhombic" insert -- system --.

Col. 11, line 2: "the" should be -- an --.

Col. 11, line 3: After "orthorhomic" insert -- system --.

UNITED STATES PATENT AND TRADEMARK OFFICE
CERTIFICATE OF CORRECTION

PATENT NO. : 6,737,690 B2
APPLICATION NO. : 10/105042
DATED : May 18, 2004
INVENTOR(S) : Takamitsu Higuchi It is certified that error appears in the above-identified patent and that said Letters Patent is hereby corrected as shown below:

Col. 11, lines 4-5: "characterized in the provision of" should be -- comprising --.

Col. 11, lines 6-7: "characterized in the provision of" should be -- comprising --.

Col. 11, lines 8-9: "characterized in the provision of" should be -- comprising --.

Col. 11, lines 10-11: "characterized in the provision of" should be -- comprising --.

Col. 12, lines 1-2: "characterized in the provision of" should be -- comprising --.

Col. 12, lines 3-4: "characterized in the provision of" should be -- comprising --.

Col. 12, lines 5-6: "characterized in the provision of" should be -- comprising --.

Col. 12, lines 7-8: "characterized in the provision of" should be -- comprising --.

Col. 12, lines 9-10: "characterized in the provision of" should be -- comprising --.

Signed and Sealed this

Thirteenth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 6,737,690 B2
APPLICATION NO. : 10/105042
DATED : May 18, 2004
INVENTOR(S) : Takamitsu Higuchi It is certified that error appears in the above-identified patent and that said Letters Patent is hereby corrected as shown below:

Title Page, (30) Foreign Application Priority:
"Mar. 26, 2003 (JP) 2001-088843" should be: -- Mar. 26, 2001 (JP) 2001-088843 --

Title Page: Term of patent should not extend beyond the expiration of USSN 10/105,002 filed 3/22/2002.

Col. 1, line 32: Delete "of".

Col. 2, line 58: Delete second occurrence of "the".

Col. 3, line 19: "(10)" should be -- (110) --.

Col. 3, line 35: "a" should be -- an --.

Col. 3, line 52: "of" should be -- or --.

Col. 4, line 43: "DRAWING" should be -- DRAWINGS --.

Col. 7, line 31: Delete "of".

Col. 9, line 56: "NaCl" should be -- NaCl --.

Col. 9, line 67: After "orthorhombic" insert -- system --.

Col. 10, line 20: "(TIN)" should be -- (TiN) --.

Col. 10, line 22: "NaCl" should be --NaCl--.

Col. 10, line 32: "rhombohedral direction and a" should be -- direction in a rhombodedral system and an --.

Col. 10, line 35: "the" should be -- an --.

Col. 10, line 36: After "orthorhombic" insert -- system --.

Col. 11, line 2: "the" should be -- an --.

Col. 11, line 3: After "orthorhombic" insert --system --.

Col. 11, lines 4-5: "characterized in the provision of" should be -- comprising --.

UNITED STATES PATENT AND TRADEMARK OFFICE
CERTIFICATE OF CORRECTION

PATENT NO. : 6,737,690 B2
APPLICATION NO. : 10/105042
DATED : May 18, 2004
INVENTOR(S) : Takamitsu Higuchi It is certified that error appears in the above-identified patent and that said Letters Patent is hereby corrected as shown below:

Col. 11, lines 6-7: "characterized in the provision of" should be -- comprising --.

Col. 11, lines 8-9: "characterized in the provision of" should be -- comprising --.

Col. 11, lines 10-11: "characterized in the provision of" should be -- comprising --.

Col. 12, lines 1-2: "characterized in the provision of" should be -- comprising --.

Col. 12, lines 3-4: "characterized in the provision of" should be -- comprising --.

Col. 12, lines 5-6: "characterized in the provision of" should be -- comprising --.

Col. 12, lines 7-8: "characterized in the provision of" should be -- comprising --.

Col. 12, lines 9-10: "characterized in the provision of" should be -- comprising --.

Signed and Sealed this

Twenty-fourth Day of April, 2007

JON W. DUDAS
*Director of the United States Patent and Trademark Office*